United States Patent
Brumley et al.

(12) 
(10) Patent No.: US 6,205,641 B1
(45) Date of Patent: Mar. 27, 2001

(54) ANVIL ASSEMBLY FOR A PRESS FOR ASSEMBLING A FASTENER INTO A WORKPIECE

(75) Inventors: James Randell Brumley, Rowlett; Jon P. Martin, Rockwall; William L. Woods, Jr., Kaufman, all of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/408,423

(22) Filed: Sep. 29, 1999

(51) Int. Cl.$^7$ .................................................. B23P 19/02
(52) U.S. Cl. .............................. 29/525; 29/251; 29/525; 227/15; 100/229 R
(58) Field of Search .............................. 29/505, 509, 512, 29/522, 523, 243.517, 243.518, 798, 525, 251; 227/15, 143, 154; 100/229 R; 72/451

(56) References Cited

U.S. PATENT DOCUMENTS

| | | | |
|---|---|---|---|
| 3,603,132 | * | 9/1971 | Holmes .................................. 72/402 |
| 3,834,011 | * | 9/1974 | Pinkerton ............................... 29/517 |
| 4,306,511 | * | 12/1981 | Ashby et al. ............................ 113/1 |
| 4,393,684 | | 7/1983 | Hansen et al. ......................... 72/451 |
| 4,555,928 | | 12/1985 | Hansen .................................... 72/451 |
| 4,614,017 | * | 9/1986 | Eckold et al. ..................... 29/243.53 |
| 4,676,421 | | 6/1987 | Swanstrom ............................... 227/8 |
| 4,752,993 | * | 6/1988 | Oaks ..................................... 29/21.1 |
| 4,831,711 | * | 5/1989 | Rapp ..................................... 29/509 |
| 4,897,912 | * | 2/1990 | Slasinski ............................. 29/432.2 |
| 4,930,203 | * | 6/1990 | Obrecht et al. ..................... 29/243.5 |
| 5,086,965 | | 2/1992 | Marsteller et al. ....................... 227/8 |
| 5,239,135 | | 8/1993 | Phillips, II ........................... 174/267 |
| 5,621,961 | * | 4/1997 | Schleicher ............................. 29/509 |

* cited by examiner

*Primary Examiner*—S. Thomas Hughes
*Assistant Examiner*—John C. Hong
(74) *Attorney, Agent, or Firm*—Locke Liddell & Sapp LLP

(57) ABSTRACT

An anvil for a press for assembling a fastener to a plate having an aperture. The press includes a ram assembly for pressing the fastener into the plate aperture. The anvil includes a housing and a pin disposed in the housing. The pin is slidable between an extended position, partially extending outwardly of the housing and is adapted to extend through the plate aperture. The pin moves to a retracted position disposed within the housing for contact with the bottom surface of the plate. The anvil further includes a collar disposed in the housing and concentrically disposed around the pin. The collar includes a plurality of spaced apart collar sections, each collar section having a bottom flange retained by the housing and a top flange. The collar sections are movable between an expanded position when the pin is in the extended position, and a collapsed position when the pin is in the retracted position within the housing. The collar sections top flanges engage the pin top surface in the pin retracted position to form a barrier below the plate aperture to prevent fastener extruded material from protruding on the plate bottom surface after the fastener is inserted into the plate.

5 Claims, 4 Drawing Sheets

ANVIL ASSEMBLY FOR A PRESS FOR ASSEMBLING A FASTENER INTO A WORKPIECE

TECHNICAL FIELD OF THE INVENTION

The present invention relates to presses of the type for inserting fasteners or the like into a workpiece, and more particularly to an anvil for such presses.

BACKGROUND OF THE INVENTION

Various fastening systems have been devised to mount electronic components to circuit boards. One system includes the mounting of threaded studs which are soldered directly to the circuit board after being inserted into holes in the board. Press-in type circuit board fasteners are inserted into printed circuit board mounting holes, and the fastener is pressed between a punch and opposing anvil. The anvil has a substantially planar face abutting the underside of the circuit board. In the assembly process, it is desirable that the underside of the printed circuit board remain smooth after the fastener is inserted for proper operation of the printed circuit board and for stacking requirements. However, because of misalignment of the fastener, improper operation of the press, or due to the thickness of the printed circuit board, it is possible that extruded material will protrude on the underside of the printed circuit board after the fastener is inserted. This protrusion necessitates circuit board repair which is costly and time consuming.

A need has thus arisen for a press, and more particularly for an anvil assembly for ensuring proper insertion of fasteners into a printed circuit board without fastener material protrusion on the underside of the board.

SUMMARY OF THE INVENTION

In accordance with the present invention, an anvil for a press for assembling a fastener to a plate is provided. The plate includes an aperture. The press includes a ram assembly for pressing the fastener into the plate aperture. The anvil includes a housing and a pin disposed in the housing. The pin is slidable between an extended position, partially extending outwardly of the housing and is adapted to extend through the plate aperture. The pin moves to a retracted position disposed within the housing for contact with the bottom surface of the plate. The anvil further includes a collar disposed in the housing and concentrically disposed around the pin. The collar includes a plurality of spaced apart collar sections, each collar section having a bottom flange retained by the housing and a top flange. The collar sections are movable between an expanded position when the pin is in the extended position, and a collapsed position when the pin is in the retracted position within the housing. The collar sections top flanges engage the pin top surface in the pin retracted position to form a barrier below the plate aperture to prevent extruded material from protruding on the plate bottom surface after the fastener is inserted into the plate.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
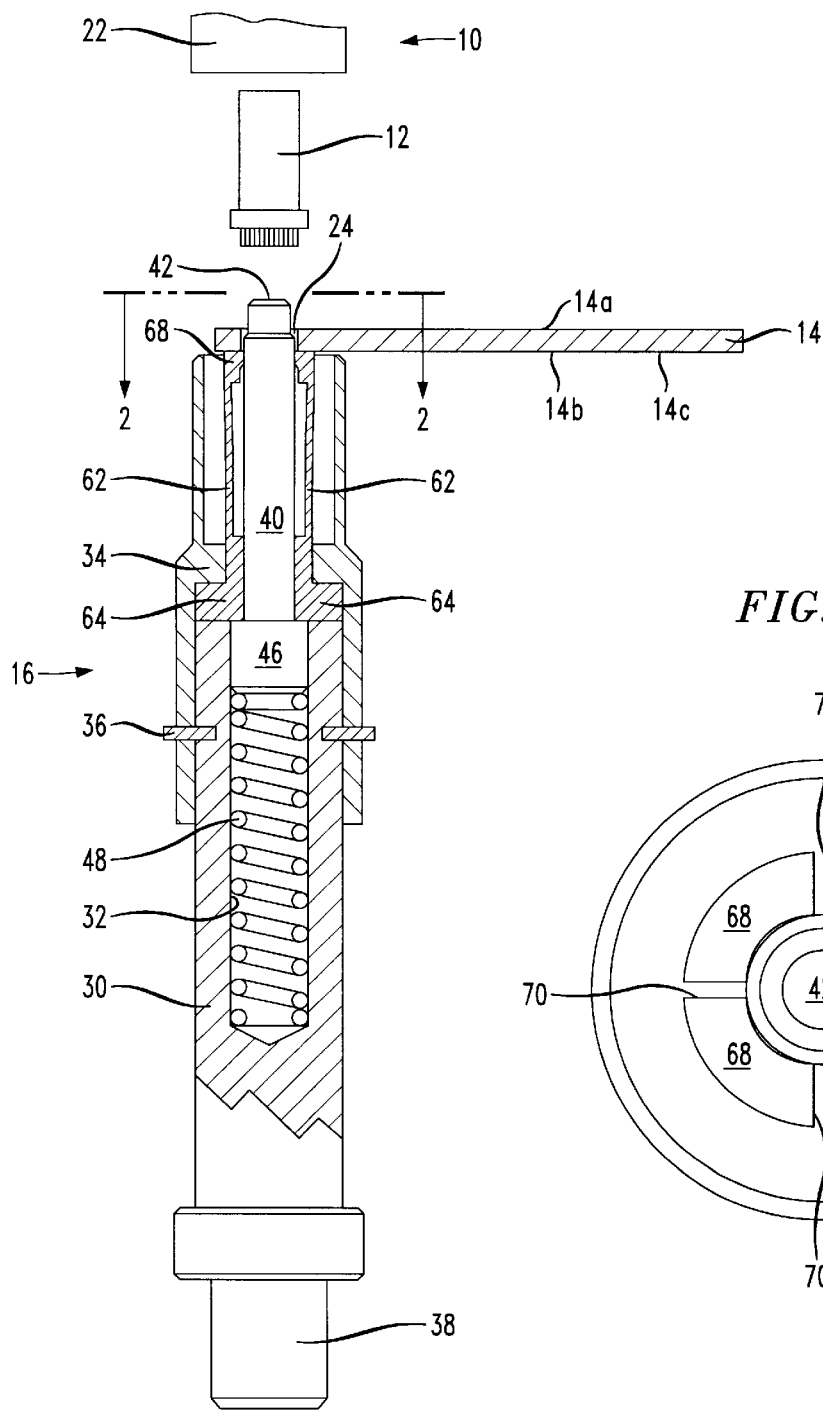
FIG. 1 is an illustration of a press having a ram for use with the present anvil and illustrating the present anvil, partially in section, with the pin in the extended position.
Figure 2:
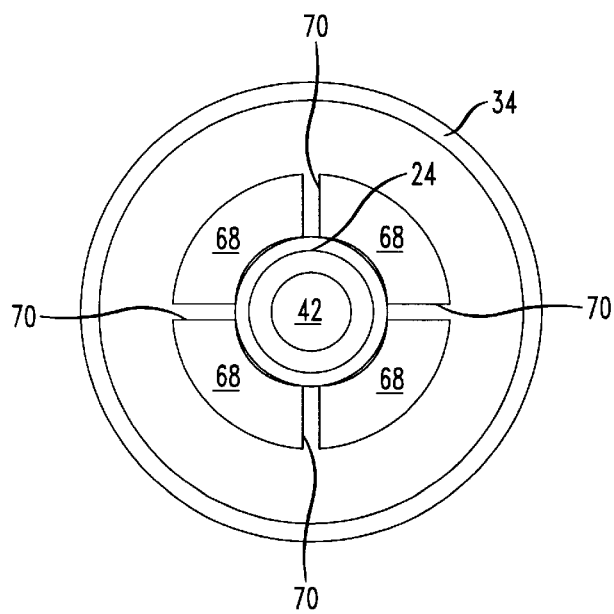
FIG. 2 is a sectional view taken generally along section lines 2—2 of FIG. 1 illustrating the present anvil with the pin in the extended position.
Figure 3:
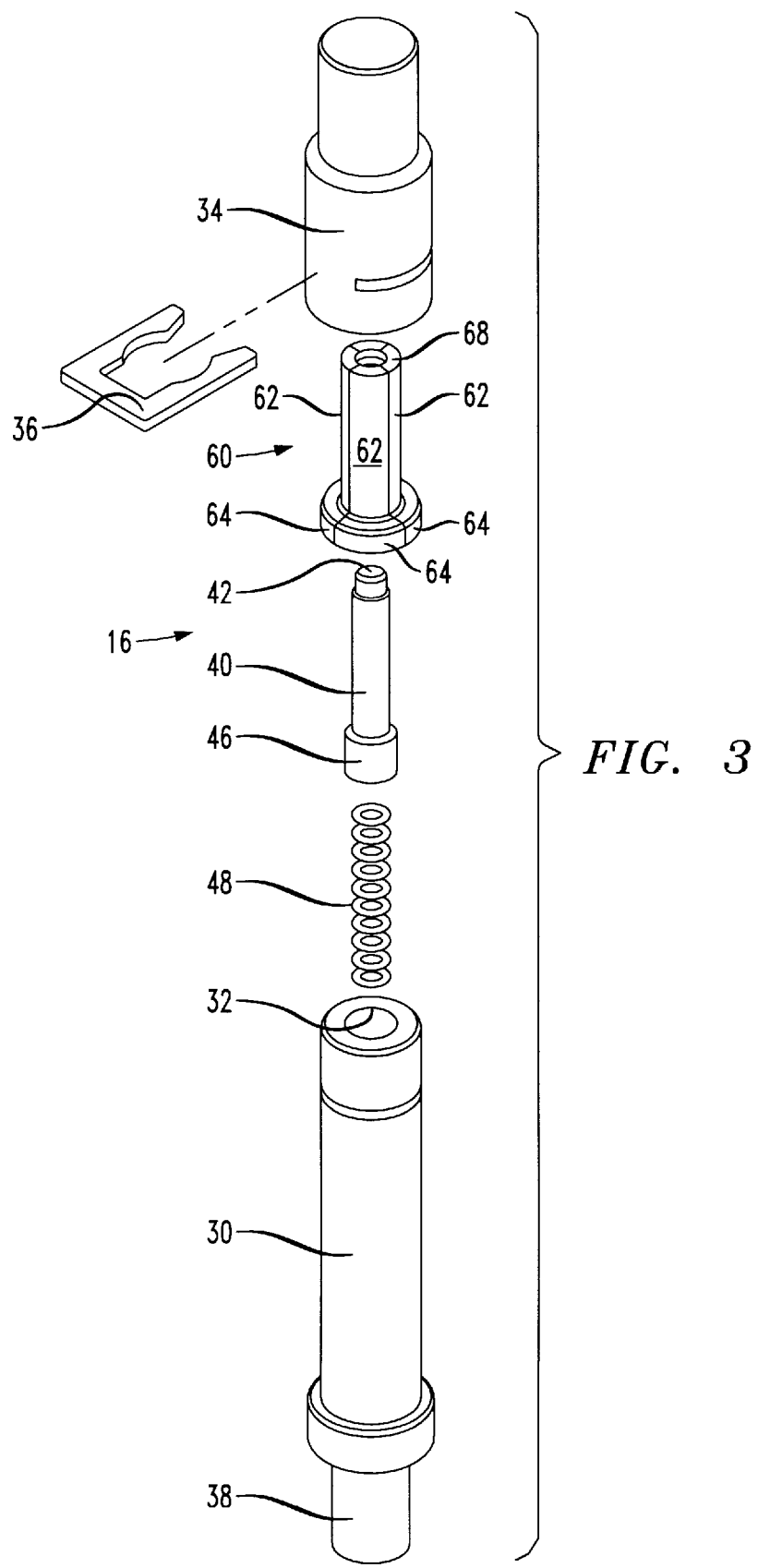
FIG. 3 is an exploded perspective view of the present anvil.
Figure 4:
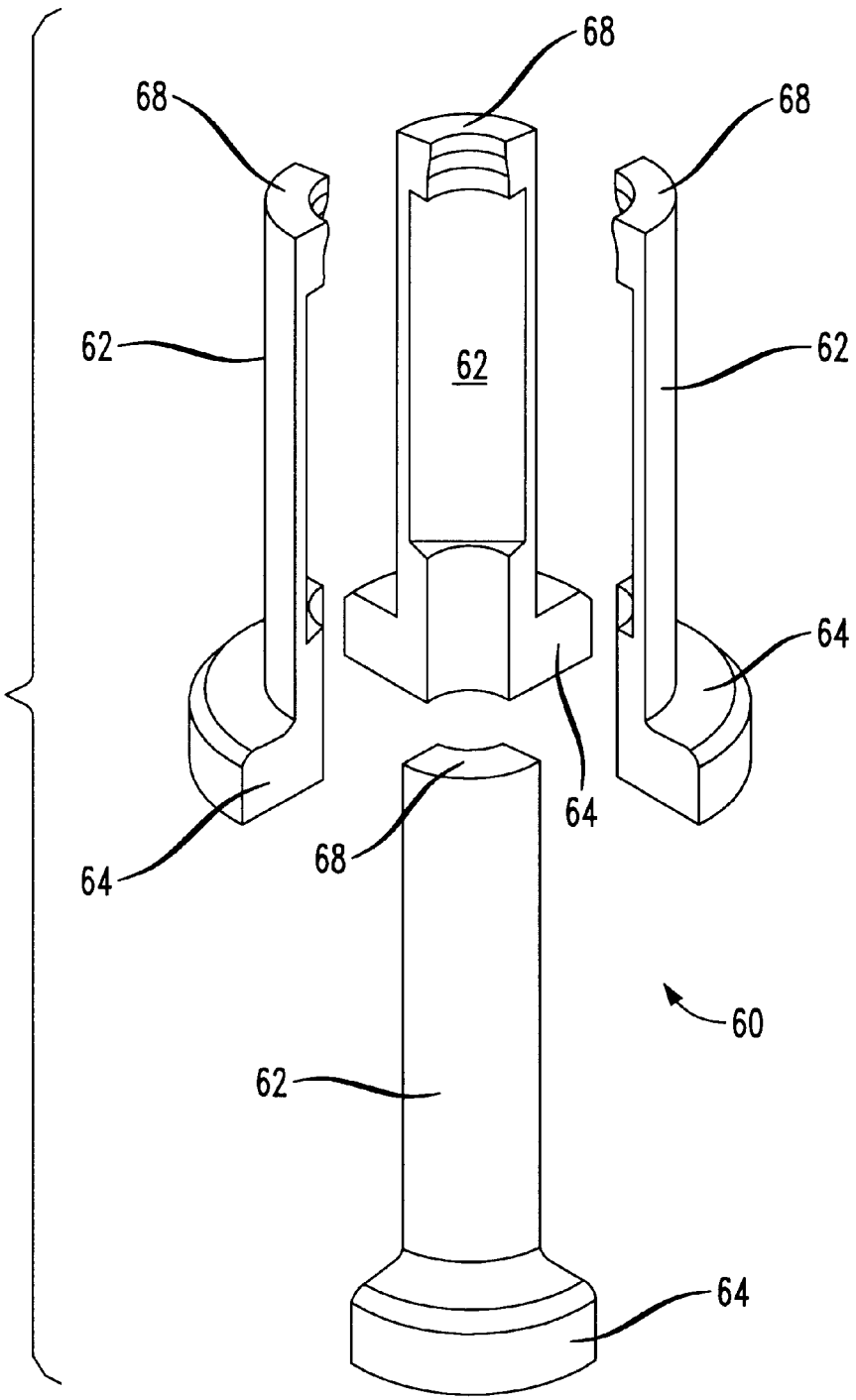
FIG. 4 is an enlarged perspective view of the present collar.

Referring to FIGS. 1, 2, and 3, a portion of a press 10 is illustrated for inserting a fastener 12 into a plate or workpiece 14 having a top surface 14a and a bottom surface 14b. Plate or workpiece 14 may comprise, for example, a printed circuit board with surface 14b including an extruded metallic layer 14c. Fastener 12 may comprise, for example, a threaded fastener such as, for example, a PEM nut or fastener described in U.S. Pat. No. 5,239,135. Press 10 includes the anvil of the present invention, generally identified by the numeral 16. Positioned above anvil 16 is a ram assembly 22 including a punch. Ram assembly 22 is raised and then lowered to press fastener 12 into an aperture 24 in workpiece 14. Workpiece 14 is positioned between ram assembly 22 and anvil 16. In accordance with the present invention, the present anvil 16 has a substantially planar face abutting the underside 14b of workpiece 14 to prevent any extruded material on surface 14b from protruding on the surface 14b of workpiece 14 after insertion of fastener 12. The operation of press 10 is more fully described in U.S. Pat. No. 4,555,928, which description and drawings are hereby incorporated by reference.

Figure 5:
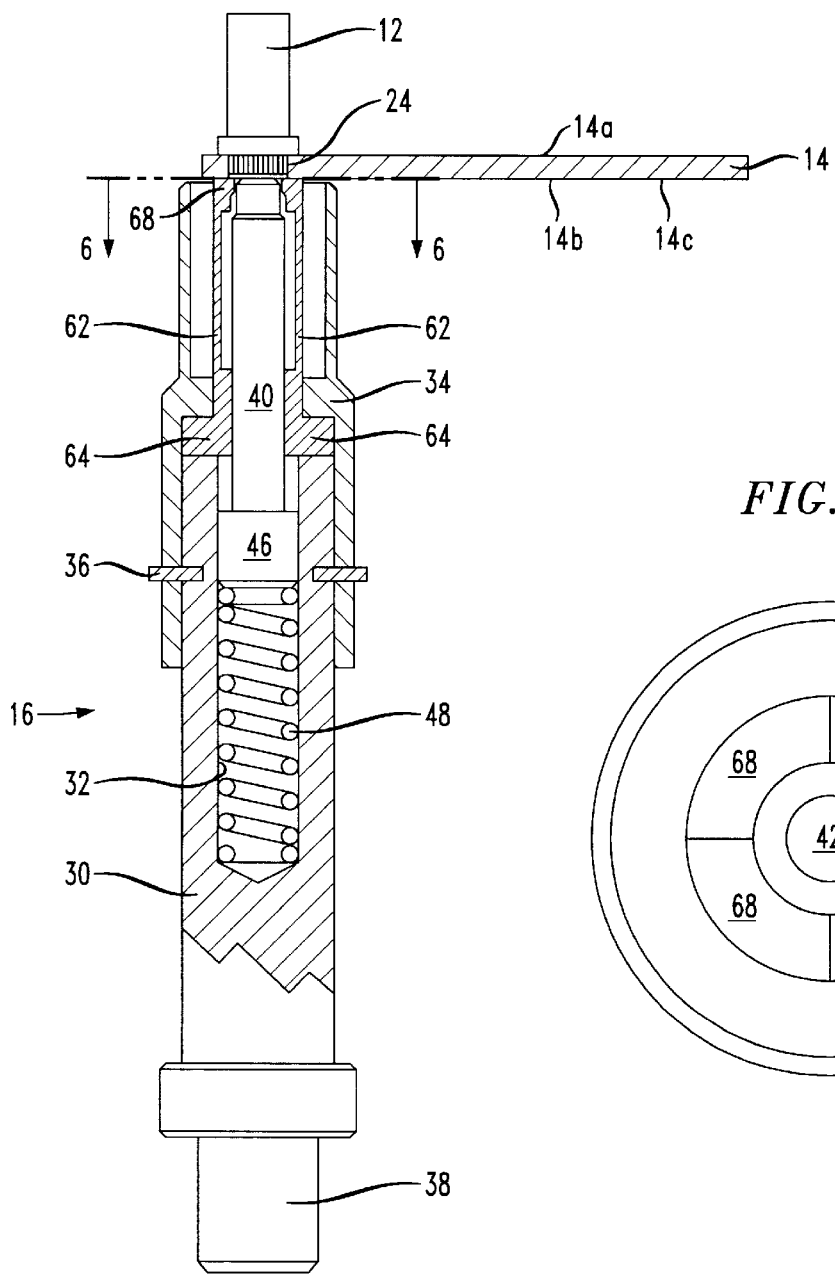
FIG. 5 is an illustration of the present anvil, partially in section, with the pin in the retracted position and a fastener inserted into the workpiece.

Anvil 16 includes a housing 30 having a cylindrical bore 32. Housing 30 further includes an end cap 34 which is mounted to housing 30 utilizing a C clip 36. Housing 30 is mounted to an anvil holder (not shown) in press 10 at end 38. Slidably disposed within housing 30 is a pin 40. Pin 40 slides within housing 30 between an extended position as illustrated in FIG. 1 and a retracted position as illustrated in FIG. 5. Pin 40 has a top surface 42 which aligns with aperture 24 of workpiece 14 when fastener 12 is inserted within aperture 24. Pin 40 includes a bottom flange 46.

Pin 40 is normally biased to the extended position through operation of a spring 48 disposed within bore 32. Spring 48 is compressed to allow pin 40 to move to the retracted position by operation of ram assembly 22 contacting fastener 12 which pushes pin 40 against spring 48 during the process of assembling fastener 12 to workpiece 14.

Referring simultaneously to FIGS. 1, 2, 3, and 4, anvil 10 further includes a collar assembly, generally identified by the numeral 60 which is disposed within housing 30 and concentrically around pin 40. Collar assembly 60 includes a plurality of spaced apart collar sections 62. Each collar section 62 has a bottom flange 64 for maintaining collar assembly 60 mounted between housing 30 and end cap 34. Bottom flange 46 of pin 40 abuts against flange 64 in the extended position of pin 40 which prevents pin 40 from detaching from anvil 16. Each collar section 62 further includes a top flange 68 which engages top surface 42 of pin 40 in the pin 40 retracted position (FIG. 5).

Figure 6:
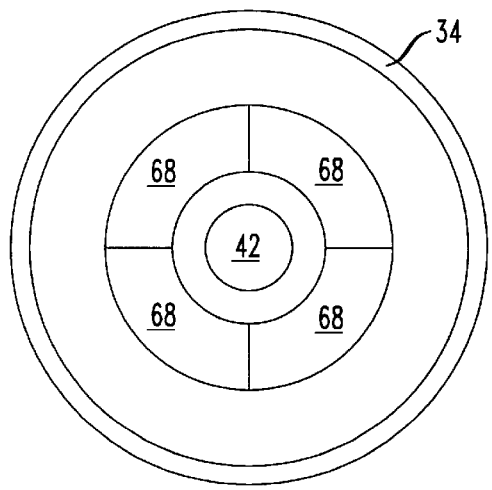
FIG. 6 is a sectional view taken generally along section lines 6—6 of FIG. 5.

As illustrated in FIGS. 1 and 5, collar sections 62 have a spring-like characteristic in that when pin 40 is in the extended position through aperture 24 of workpiece 14, collar sections 62 are expanded outwardly, such that top flanges 68 of collar sections 62 engage the sides of pin 40 and gaps 70 (FIG. 2) are formed between collar sections 62. When pin 40 is inserted into housing 30 due to operation of ram assembly 22, top surface 42 of pin 40 is disposed below bottom surface 14b of workpiece 14 which causes top flanges 68 of collar sections 62 to move to a collapsed position (FIG. 5) which is the normal unbiased position for collar assembly 60, such that top flanges 68 of collar sections 62 encircle top surface 42 of pin 40 closing gaps 70 thereby increasing the area of top surface 42 of pin 40. This increased surface area forms an area greater than the diameter of aperture 24 of workpiece 40 below aperture 24 as illustrated in FIG. 6, such that anvil 16 forms a barrier below aperture 24 to prevent any extruded material 14c on surface 14b protruding to bottom surface 14b of workpiece 14 as fastener 12 is inserted into workpiece 14. The spring-like characteristic of collar sections 62 causes collar assembly 60 to automatically collapse around pin 40 as pin 40 is retracted into housing 30.

After assembly, ram assembly 22 is raised to allow workpiece 14 to be removed from anvil 16 with the result that spring 48 causes pin 40 to extend from housing 30 and thereby expand collar sections 62.

Pin 40 in combination with collar assembly 60 functions to provide a barrier below bottom surface 14b of workpiece 14 to prevent the protrusion of material from insertion of fastener 12 onto bottom surface 14b of workpiece 14. Additionally, pin 40 functions to align fastener 12 with aperture 24 of workpiece 14 prior to the lowering of ram assembly 22 to better ensure proper alignment of fastener 12 in aperture 24.

It therefore can be seen that the present anvil having a collapsible collar creates a barrier below a workpiece to prevent protrusion of extruded material from extending onto the bottom of the workpiece. The present anvil functions to locate a fastener within an aperture in a workpiece and eliminates protrusion of fastener material on the underside of the workpiece, particularly printed circuit boards.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. An anvil for a press for assembling a fastener to a plate, the plate having a top surface and a bottom surface, the plate further having an aperture having a diameter, the press including a ram assembly for pressing the fastener into the plate aperture, the ram assembly being disposed above the anvil, the plate being disposed between the ram assembly and the anvil, such that the plate top surface is disposed adjacent the ram assembly, and the plate aperture being in alignment with the anvil, the anvil comprising:

a housing;

a pin disposed within said housing, said pin having a top surface, said top surface having an area, said pin being slidable between an extended position, partially extending outwardly of said housing and adapted to extend through the plate aperture, and a retracted position wherein said pin is disposed within said housing, such that said pin top surface is disposed below the bottom surface of the plate; and a collar disposed in said housing and concentrically disposed around said pin, said collar including a plurality of spaced apart collar sections, each collar section having a bottom flange retained by said housing and a top flange, each top flange having a top surface, said top surface thereof having an area, said top flanges forming an adjustable aperture having a first diameter and a second diameter through which said pin slides, said collar sections being movable between an expanded position when said pin is in said extended position and said collar aperture has said first diameter and a collapsed position when said pin is in said retracted position and said collar aperture has said second diameter, said second diameter being less than said first diameter, such that said collar sections top flanges are disposed adjacent said pin top surface in said pin retracted position to form a barrier below the plate aperture, said barrier including said area of said pin top surface and said area of said top surface of said top flanges, and wherein said collar aperture second diameter is less than the diameter of the plate aperture.

2. The anvil of claim 1 and further including:

a spring disposed within said housing for positioning said pin in said extended position.

3. The anvil of claim 1 wherein said collar includes four collar sections.

4. The anvil of claim 1 wherein said housing includes an end cap for fastening said collar to said housing.

5. A method for assembling a fastener to a plate using a press, the plate having a top surface and a bottom surface, the plate further having an aperture having a diameter, the press including a ram assembly for pressing the fastener into the plate aperture, the ram assembly being disposed above the anvil, the plate being disposed between the ram assembly and the anvil such that the plate top surface is disposed adjacent the ram assembly, and the plate aperture being in alignment with the anvil, the method comprising:

providing a pin in a housing, the pin having a top surface and being slidable between an extended position, partially extending outwardly of the housing and adapted to extend through the plate aperture, and a retracted position disposed within the housing, such that the pin top surface is disposed below the bottom surface of the plate;

providing a collar disposed in the housing and concentrically disposed around the pin, the collar including a plurality of spaced apart collar sections, each collar section having a bottom flange retained by the housing and a top flange, each top flange having a top surface having an area, the collar sections being movable between an expanded position when the pin is in the extended position and a collapsed position when the pin is in the retracted position and forming an adjustable aperture having a first diameter and a second diameter;

moving the ram assembly to engage the fastener and slide the pin from the extended position to the retracted position;

pressing the fastener into the plate aperture;

collapsing the collar and causing the collar sections to move adjacent to the pin top surface and the adjustable aperture having the second diameter; and forming a barrier including the top surface of the pin and the area of the top surface of the top flanges under the plate aperture, such that the collar sections are disposed within an area below the plate aperture with the adjustable aperture having the second diameter less than the plate aperture diameter.

* * * * *